(12) United States Patent
Carothers

(10) Patent No.: US 12,159,841 B2
(45) Date of Patent: *Dec. 3, 2024

(54) HETEROGENEOUS INTEGRATED CIRCUIT FOR SHORT WAVELENGTHS

(71) Applicant: Samsung Electronics Co., Ltd., Suwon-si (KR)

(72) Inventor: Daniel N. Carothers, Lucas, TX (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/741,972

(22) Filed: May 11, 2022

(65) Prior Publication Data

US 2022/0270977 A1    Aug. 25, 2022

Related U.S. Application Data

(63) Continuation of application No. 16/792,114, filed on Feb. 14, 2020, now Pat. No. 11,393,765, which is a
(Continued)

(51) Int. Cl.
*H01L 23/00* (2006.01)
*G02B 6/13* (2006.01)
(Continued)

(52) U.S. Cl.
CPC .......... *H01L 23/5386* (2013.01); *G02B 6/13* (2013.01); *H01L 23/49838* (2013.01);
(Continued)

(58) Field of Classification Search
CPC .......... H01L 24/29; H01L 24/20; H01L 24/97; H01L 24/24; H01L 24/83; H01L 25/167;
(Continued)

(56) References Cited

U.S. PATENT DOCUMENTS 6,071,795 A   6/2000 Cheung et al.
6,343,171 B1  1/2002 Yoshimura et al.
(Continued)

FOREIGN PATENT DOCUMENTS

CN        102473744 A     5/2012
KR   10-2012-0024806      3/2012

OTHER PUBLICATIONS

Chinese Notice Of Allowance dated May 10, 2023, issued in corresponding Chinese Patent Application No. 201811213720.0 (7 pages).

*Primary Examiner* — Hrayr A Sayadian
(74) *Attorney, Agent, or Firm* — Lewis Roca Rothgerber Christie LLP

(57) ABSTRACT

A heterogeneous semiconductor structure, including a first integrated circuit and a second integrated circuit, the second integrated circuit being a photonic integrated circuit. The heterogeneous semiconductor structure may be fabricated by bonding a multi-layer source die, in a flip-chip manner, to the first integrated circuit, removing the substrate of the source die, and fabricating one or more components on the source die, using etch and/or deposition processes, to form the second integrated circuit. The second integrated circuit may include components fabricated from cubic phase gallium nitride compounds, and configured to operate at wavelengths shorter than 450 nm.

17 Claims, 20 Drawing Sheets

Related U.S. Application Data continuation of application No. 15/902,753, filed on Feb. 22, 2018, now Pat. No. 10,564,356.

(60) Provisional application No. 62/587,197, filed on Nov. 16, 2017.

(51) Int. Cl.
  *H01L 23/498* (2006.01)
  *H01L 23/538* (2006.01)
  *H01P 5/107* (2006.01)

(52) U.S. Cl.
  CPC .............. *H01L 24/16* (2013.01); *H01P 5/107* (2013.01); *H01L 2924/10253* (2013.01)

(58) Field of Classification Search
  CPC ..... H01L 23/5386; H01L 24/19; H01L 24/92; H01L 23/49838; H01L 24/82; H01L 24/32; H01L 24/16; H01L 2224/24145; H01L 2224/83203; H01L 2224/29187; H01L 2224/92144; H01L 2224/04105; H01L 2224/82106; H01L 2224/83896; H01L 2224/97; H01L 2224/32145; H01L 24/27; H01L 2224/24011; H01L 2924/10253; H01L 2224/27444; H01L 2224/29188; H01L 2224/83005; H01L 2224/83948; H01L 2224/92244; H01L 2924/05442; H01L 2924/00012; H01L 2224/83; H01L 31/1856; H01L 31/035209; H01L 31/02327; H01L 31/03048; G02B 6/13; G02B 2006/12035; G02B 6/136; H01P 5/107
  USPC .......................................................... 257/213
  See application file for complete search history.

(56) References Cited

U.S. PATENT DOCUMENTS

| | | |
|---|---|---|
| 6,611,635 B1 | 8/2003 | Yoshimura et al. |
| 6,684,007 B2 | 1/2004 | Yoshimura et al. |
| 6,690,845 B1 | 2/2004 | Yoshimura et al. |
| 6,706,546 B2 | 3/2004 | Yoshimura et al. |
| 6,845,184 B1 | 1/2005 | Yoshimura et al. |
| 8,536,615 B1 | 9/2013 | Driscoll et al. |
| 9,040,326 B2 | 5/2015 | Zhong et al. |
| 9,178,091 B2 | 11/2015 | Arena et al. |
| 9,287,454 B2 | 3/2016 | Kawashima |
| 9,482,691 B1 | 11/2016 | Ukhanov et al. |
| 10,564,356 B2 * | 2/2020 | Carothers .............. G02B 6/136 |
| 2003/0132433 A1 | 7/2003 | Piner et al. |
| 2009/0278233 A1 | 11/2009 | Pinnington et al. |
| 2010/0096668 A1 | 4/2010 | Briere |
| 2010/0221897 A1 | 9/2010 | Seong |
| 2013/0299877 A1 * | 11/2013 | Briere ................. H01L 21/8258 257/192 |
| 2015/0079770 A1 | 3/2015 | Wierer, Jr. et al. |
| 2015/0108427 A1 | 4/2015 | Brueck et al. |
| 2016/0064439 A1 | 3/2016 | Or-Bach et al. |
| 2017/0162747 A1 | 6/2017 | Aoyagi et al. |
| 2017/0310076 A1 | 10/2017 | Bayram et al. |
| 2019/0067900 A1 | 2/2019 | Bhattacharya et al. |

\* cited by examiner

| Layer | Thickness (nm) | Material | x fraction | Dopant | Concentration (1/cm^3) |
|---|---|---|---|---|---|
| Contact Metal | | Ti/Al | | | |
| Anode Contact | 10 | Al(x)Ga(1-x)N | 0.15 | Silicon | 2E+19 |
| Tunnel Junction | 5 | In(x)Ga(1-x)N | 0.2 | NID | |
| Anode Buffer 1 | 5 | Al(x)Ga(1-x)N | 0.1 | Magnesium | 1E+19 |
| Anode Buffer 2 | 10 | Al(x)Ga(1-x)N | 0.15 | Magnesium | 2.5E+18 |
| Barrier | 7 | Al(x)Ga(1-x)N | 0.1 | NID | |
| Well | 3 | Al(x)Ga(1-x)N | 0 | NID | |
| Barrier | 7 | Al(x)Ga(1-x)N | 0.1 | NID | |
| Well | 3 | Al(x)Ga(1-x)N | 0 | NID | |
| Barrier | 7 | Al(x)Ga(1-x)N | 0.1 | NID | |
| Well | 3 | Al(x)Ga(1-x)N | 0 | NID | |
| Barrier | 7 | Al(x)Ga(1-x)N | 0.1 | NID | |
| Cathode Buffer 1/ Waveguide | 10 | Al(x)Ga(1-x)N | 0.15 | Silicon | 3E+18 |
| Cathode Contact/ Waveguide | 20 | Al(x)Ga(1-x)N | 0.15 | Silicon | 2E+19 |
| Contact Metal | | Ti/Al | | | |

FIG. 2B

HETEROGENEOUS INTEGRATED CIRCUIT FOR SHORT WAVELENGTHS

CROSS-REFERENCE TO RELATED APPLICATIONS

The present application is a continuation of U.S. patent application Ser. No. 16/792,114, filed Feb. 14, 2020, which is a continuation of U.S. patent application Ser. No. 15/902,753, filed Feb. 22, 2018, issued as U.S. Pat. No. 10,564,356, which claims priority to and the benefit of U.S. Provisional Application No. 62/587,197, filed Nov. 16, 2017, entitled "SIZE SCALED PHOTON IC INTEGRATED CIRCUIT FORMATION LEVERAGING HETEROGENEOUS INTEGRATION OF III-NITRIDE'S", the entire contents of all of which are incorporated herein by reference.

FIELD

One or more aspects of embodiments according to the present invention relate to integrated circuits, and more particularly to heterogeneous integrated circuits combining optical and electrical functions.

BACKGROUND

Over the last two decades researchers have developed photonic equivalents of the transistor, and even been able to construct all-optical logic circuits. These devices could even be made much faster than existing silicon transistor equivalents. However the power requirements of the photonic devices and their size are currently many orders of magnitude higher than the transistor equivalent. The power dissipation of such photonic devices may limit the integration density achievable with them.

Thus, there is a need for an improved integrated circuit structure providing optical functionality.

SUMMARY

Aspects of embodiments of the present disclosure are directed toward a heterogeneous semiconductor structure, including a first integrated circuit and a second integrated circuit, the second integrated circuit being a photonic integrated circuit. The heterogeneous semiconductor structure may be fabricated by bonding a multi-layer source die, in a flip-chip manner, to the first integrated circuit, removing the substrate of the source die, and fabricating one or more components on the source die, using etch and/or deposition processes, to form the second integrated circuit. The second integrated circuit may include components fabricated from cubic phase gallium nitride compounds, and configured to operate at wavelengths shorter than 450 nm.

According to an embodiment of the present invention there is provided a heterogeneous semiconductor structure, including: a first integrated circuit, having a silicon substrate; a bonding layer on the first integrated circuit; and a second integrated circuit on the bonding layer, the second integrated circuit including cubic phase gallium nitride compounds as a major component.

In one embodiment, an overall thickness of the second integrated circuit is less than 2 microns.

In one embodiment, the second integrated circuit includes a passive waveguide on the bonding layer.

In one embodiment, the passive waveguide has a cut-off wavelength, for the lowest-order transverse magnetic mode, of less than 500 nm.

In one embodiment, the passive waveguide has a width greater than 30 nm and less than 80 nm.

In one embodiment, the passive waveguide has a thickness greater than 20 nm and less than 50 nm.

In one embodiment, the passive waveguide includes: a first layer of n-doped AlGaN, with a first doping concentration, on the bonding layer; and a second layer of n-doped AlGaN, with a second doping concentration, greater than the first doping concentration, on the first layer of n-doped AlGaN.

In one embodiment, the structure includes an active device on the bonding layer.

In one embodiment, the active device includes the first layer of n-doped AlGaN; the second layer of n-doped AlGaN; a first barrier layer composed of intrinsic AlGaN; a quantum well layer composed of intrinsic AlGaN; a second barrier layer composed of intrinsic AlGaN; and a layer of p-doped AlGaN.

In one embodiment, the quantum well layer has a thickness of less than 5 nm.

In one embodiment, each of the first barrier layer and the second barrier layer has a thickness of less than 10 nm.

In one embodiment, the active device is configured to operate as a component selected from the group consisting of optical gain elements, modulators, and detectors.

According to an embodiment of the present invention there is provided a method for fabricating a heterogeneous semiconductor structure, the method including: bonding a source die to a target wafer, the source die including a GaAs substrate and a first plurality of layers on the GaAs substrate, the bonding including bonding the source die to the target wafer with the first plurality of layers facing the target wafer, each of the first plurality of layers including cubic phase gallium nitride compounds as a major component; and removing the GaAs substrate.

In one embodiment, the first plurality of layers has an overall thickness of less than 2 microns.

In one embodiment, the method includes etching the active device top layer, to form a first portion of an active device.

In one embodiment, the method includes patterning and etching the photonic waveguide layer to form: a passive waveguide; a second portion of the active device, the second portion having a contact pad surface; and forming a metal contact pad on the contact pad surface.

In one embodiment, the passive waveguide has a width greater than 30 nm and less than 80 nm, and a thickness greater than 20 nm and less than 50 nm.

In one embodiment, the active device includes a first layer of n-doped AlGaN, with a first doping concentration; and a second layer of n-doped AlGaN, with a second doping concentration, greater than the first doping concentration; a first barrier layer composed of intrinsic AlGaN; a quantum well layer composed of intrinsic AlGaN; a second barrier layer composed of intrinsic AlGaN; and a layer of p-doped AlGaN.

In one embodiment, the quantum well layer has a thickness of less than 5 nm, and each of the first barrier layer and the second barrier layer has a thickness of less than 10 nm.

According to an embodiment of the present invention there is provided a heterogeneous semiconductor structure, including: a first integrated circuit, having a silicon substrate; a bonding layer on the first integrated circuit; and a second integrated circuit on the bonding layer, the second integrated circuit having an overall thickness of less than 500 nm.

BRIEF DESCRIPTION OF THE DRAWINGS

These and other features and advantages of the present invention will be appreciated and understood with reference to the specification, claims, and appended drawings wherein:

FIG. 2B is a table showing layer characteristics, according to an embodiment of the present invention;

DETAILED DESCRIPTION

The detailed description set forth below in connection with the appended drawings is intended as a description of exemplary embodiments of a heterogeneous integrated circuit for short wavelengths provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

In a photonic integrated circuit, the dimensions of optical waveguides and active elements may be scaled to the operating wavelength, e.g., smaller components may be capable of acceptable performance, if the wavelength is correspondingly reduced. The use of smaller components may, in turn, increase the achievable integration density. Certain materials, such as III-Nitrides, enable the generation and detection of light at much shorter wavelengths than in other, e.g., silicon-based, photonic integrated circuits. AlGaN and GaN materials allow operation at wavelengths as short as 200 nm. This may make possible a reduction of the diameter of active elements to 100 nm or less, and waveguides as narrow as 50 nm and as thin as 10 nm. In some embodiments the dimensions are selected such that within the operating wavelength range the lowest order transverse electric mode (the TE00 mode) is able to propagate and the lowest order transverse magnetic mode (the TM00 mode) is cut off. For example, the waveguide may have a cut-off wavelength, for the lowest-order transverse magnetic mode, of less than 500 nm. The dimensions of active devices may be slightly larger, and the lowest order transverse magnetic mode may not be cut off within the active devices. These waveguides may be able to transmit a signal up to 10 cm with a few microamperes or less of drive current.

Figure 1A:
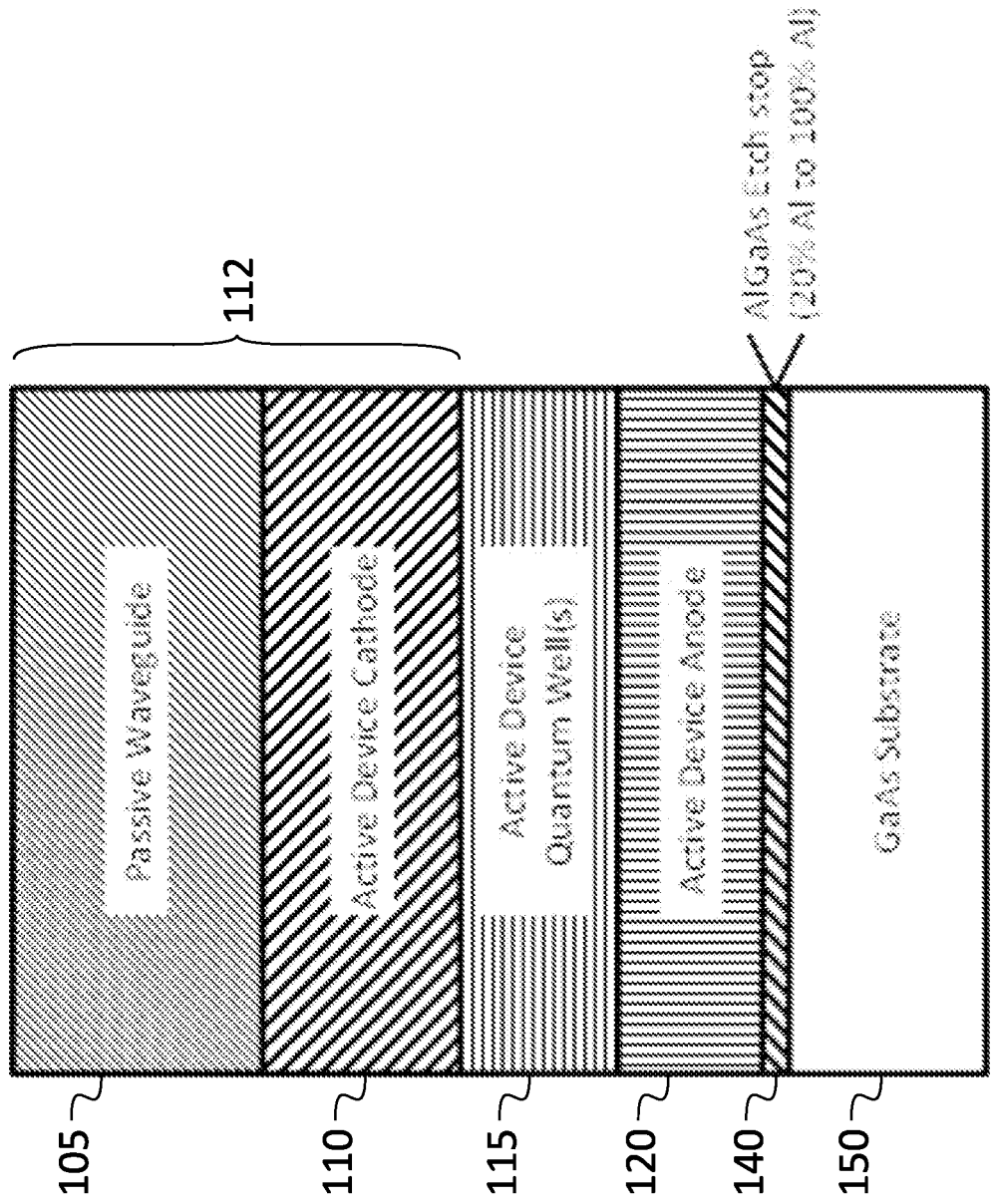
FIG. 1A is a schematic drawing of a source wafer, according to an embodiment of the present invention.
Figures 1B, 1C:
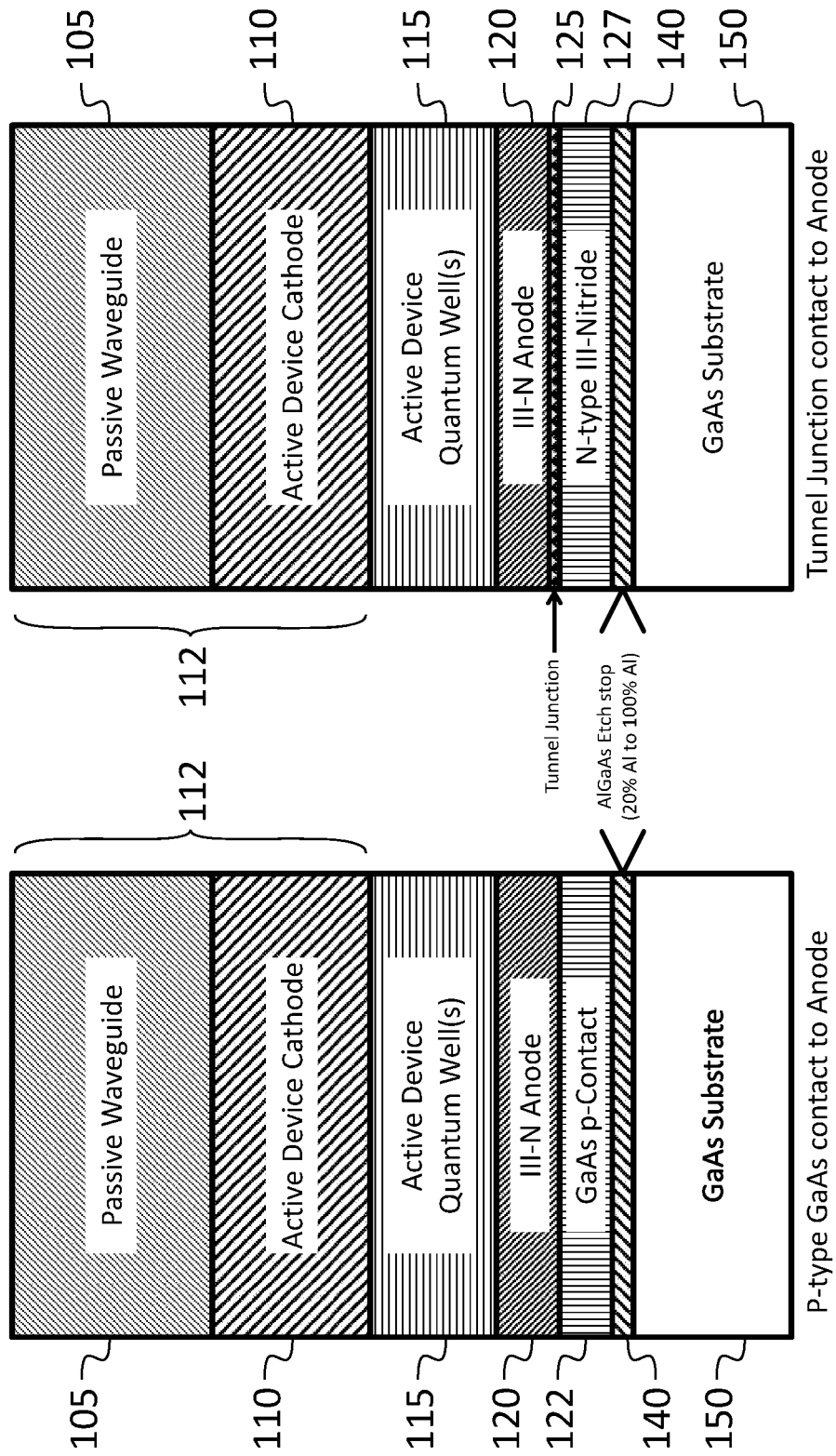
FIG. 1B is a schematic drawing of a source wafer, according to an embodiment of the present invention.
FIG. 1C is a schematic drawing of a source wafer, according to an embodiment of the present invention.

A wafer (or "source wafer") for forming a portion of a heterogeneous semiconductor structure may be formed by depositing a plurality of layers, using epitaxy, on a GaAs substrate, to form source wafers such as those illustrated in FIG. 1A-FIG. 1C. The source wafer of FIG. 1A includes a passive waveguide layer 105, an active device cathode layer 110, an active device layer 115, an active device anode layer 120, an etch stop layer 140, and a gallium arsenide (GaAs) source substrate 150. The passive waveguide layer 105, and the active device cathode layer 110 may together form a (composite) photonic waveguide layer 112 that may be used to fabricate photonic waveguides such as ridge waveguides and/or channel waveguides, as described in further detail below. As used herein, a "channel waveguide" has a rectangular cross section and a "ridge waveguide" has a stepped cross section. Similarly, the active device layer 115 may be a composite layer, including, e.g., one or more barrier layers and one or more quantum well layers, as described in further detail below. As used herein, a "layer" may be a monolithic layer lacking internal structure (like the etch stop layer 140) or a "layer" may be a composite layer (like the photonic waveguide layer 112) including one or more (monolithic or composite) layers.

Referring to FIG. 1A-FIG. 1C, in some embodiments, III-N materials are integrated on a GaAs substrate to enable the development of photonic circuits operating at short wavelengths. The use of a GaAs substrate for the formation of structures composed of III-N materials may be advantageous because GaAs substrates may be readily available in larger diameters (e.g., 150 mm, 200 mm, or 300 mm) than any other III-V material, and may be less expensive and highly compatible with the processes required to achieve the target level of integration (i.e., deep submicron photonic devices). Moreover, GaAs has lower yield strength than other substrates such as SiC or sapphire, so cracking and plastic deformation may be more likely to occur within the substrate as opposed to the epitaxial films; this characteristic may further improve epitaxial film quality. Further, the isoelectronic structure of GaAs may be beneficial as it and GaN are both III-V based materials sharing a common gallium atom, and the selection of the surface state of the GaAs wafer (GaAs or AlGaAs) and intermediate layer (GaN/AlN) allows unique selection of growth angle and crystal symmetry (cubic or hexagonal) of the III-N material. Cubic GaN, which exhibits a higher crystallographic symmetry than hexagonal phases, may have superior electrical and optical properties, such as lower phonon scattering and lower electron effective mass. Parallel cleaving planes may exist between the III-N epitaxy and GaAs substrate. GaAs substrates are commercially available in a wide range of crystallographic substrate orientations, having either polar or non-polar stacking. A GaAs wafer parallel to the (001) crystal plane (which may be referred to as (001) GaAs) is one of the few semiconductor substrates on which metastable zincblende GaN films will naturally form, and (111) GaAs can provide an even better template for the growth of thick GaN films for device fabrication, eliminating many of the issues associated with heteroepitaxy.

Two methods of contacting p type III-N materials may be used, with the structures of FIG. 1B and FIG. 1C, respectively. In the embodiment of FIG. 1B, a p-type GaAs contact layer 122 (illustrated), or an AlGaAs contact layer, is formed on the etch stop layer 140. In the embodiment of FIG. 1C, a tunnel junction layer 125 is formed between the III-N anode and an n-type III-N layer 127. As discussed and illustrated in further detail below, a metal contact may then be formed on the p-type contact layer (in the case of the embodiment of FIG. 1B) or on the n-type III-N layer (in the case of the embodiment of FIG. 1C).

The size of a photonic structure may be functionally determined by its ability to constrain and guide an optical mode, or to provide significant overlap between optical modes to allow interaction between an optical nonlinearity. The shorter the wavelength, the more compact the mode. In some embodiments, operating wavelengths from 200 nm to 450 nm are used. In some embodiments waveguides with waveguide widths of 30 nm to 80 nm and waveguide thicknesses of 20 nm to 50 nm are used. In some embodiments a minimum device spacing of between 50 nm and 120 nm is used, made possible in part by low cross-coupling between waveguides and active elements.

In some embodiments, a common resonant optical gain element is used to generate and detect radiation. Resonant optical gain elements are flexible and may be used to implement a wide range of functional elements within a photonic circuit, such as optical switches (via optical nonlinearities and phase control), optical logic gates (via large nonlinearities and optically introduced phase shifts), and detectors for signal detection of radiation (in which, for example, photons are absorbed and drive electrons into a conduction band state, and the electrons are then swept out under reverse bias). For detection below threshold, the optical signal coupled into the cavity is absorbed, generating an electron hole pair. With the resonant structure the optical absorption is enhanced as the signal makes multiple passes, increasing the effective absorption length. The generated carriers create a differential carrier distribution across the diode junction, which in turn generates a measureable current. To detect a signal while the resonant gain element is biased for photon generation and/or amplification involves a different set of interactions. Here, as the input signal changes the photon density in the cavity, there will be a corresponding carrier density change. This has a proportional effect on the quasi-Fermi levels, impacting the charge injection level and diode voltage.

Resonant gain elements may be used in a flexible manner for the detection of optical signals, allowing detection while either emitting light or in an off state. Different physical interactions within the device are responsible for detection in each case. This makes it possible to optimize the application of resonant gain elements by controlling the emission state of the receiving element. It further makes possible the construction of links capable of bidirectional data transport in the same waveguide.

The passive waveguide layers of FIG. 1A-FIG. 1C (from which waveguides may be formed, as described in further detail below, by patterning and etching), may be composed of doped AlN and/or AlGaN materials.

Figure 2A:
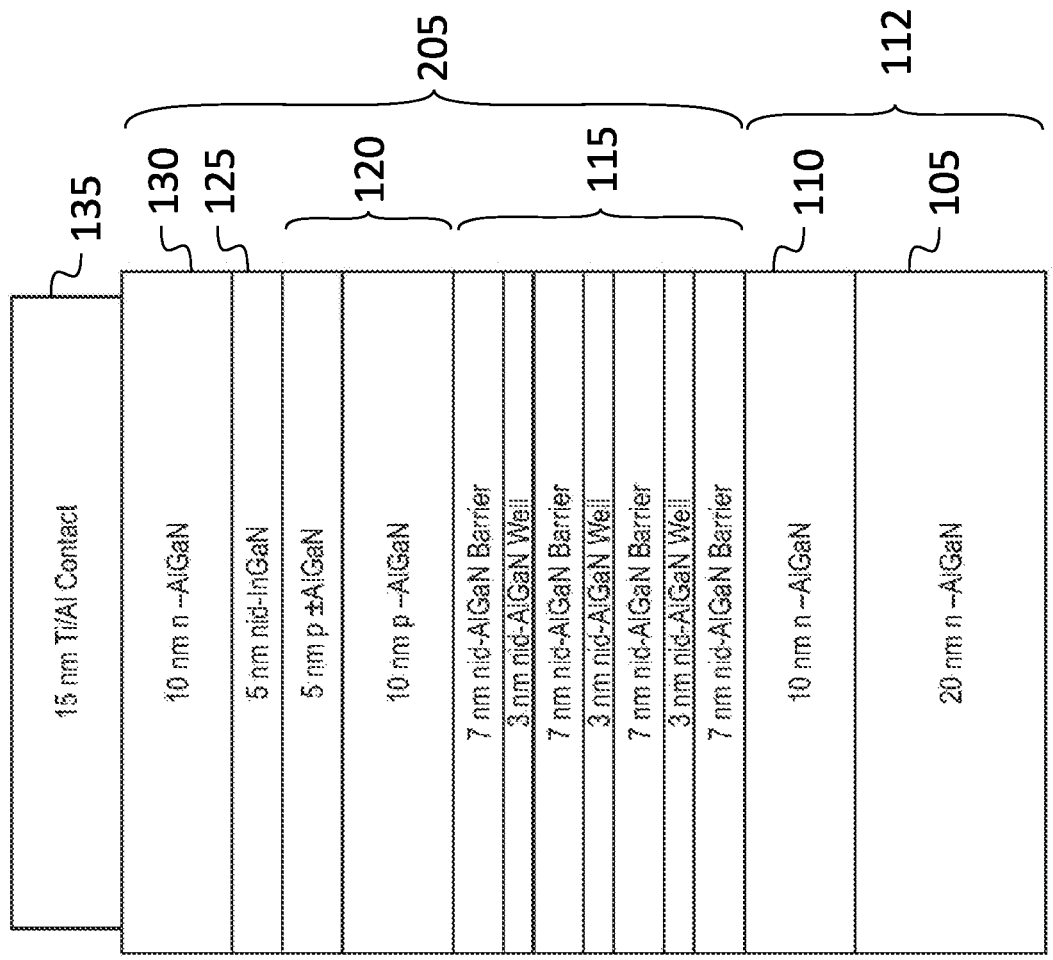
FIG. 2A is a schematic drawing of a portion of a source die, according to an embodiment of the present invention.

FIG. 2A shows a detailed view of the layers of FIG. 1C, after the substrate and etch stop layer have been removed, as described in further detail below, and a metal (e.g., Ti/Al contact) has been formed on the n-type III-N layer (i.e., the n-AlGaN layer of FIG. 2A), as also described in further detail below. The table of FIG. 2B shows characteristics of the layers of the structure of FIG. 2A, and (in the last row) characteristics of a cathode contact that may be added after the processing of the device. Such a structure may include binary and trinary III-Nitride epitaxy layers (as shown) as well as quaternary III-Nitride epitaxy layers. Such layers may be grown by epitaxy on a GaAs substrate, as mentioned above. The materials used may be based on three binary components: GaN, AlN, InN, and may also include alloys of these materials, such as AlInGaN, InGaNAs, InGaN, InAlN, and GaNAs. These alloys may be collectively referred to as "gallium nitride compounds".

The view of FIG. 2A is inverted relative to the view of FIG. 1C because, in some embodiments, the process for forming a heterogeneous semiconductor structure involves bonding the wafer of FIG. 1C to a target wafer in a flip-chip manner, i.e., "upside down" (with the passive waveguide layer of FIG. 1C facing the target wafer). In some embodiments, the layers remaining after the removal of the substrate and etch stop layer include a passive waveguide layer 105, a cathode layer 110 (which may be doped differently from the passive waveguide layer 105), a plurality of not-intentionally-doped ("nid", or "NID", or "intrinsic") layers that together form a multiple quantum well layer 115, two layers that together form an anode layer 120, a tunnel junction layer 125 and an anode contact layer 130. The anode metal contact 135 also shown in FIG. 2A may be added during subsequent processing steps described in further detail below. The layers above the cathode layer 110 and below the anode metal contact 135 may collectively be referred to as the active device top layer 205.

Figure 3:
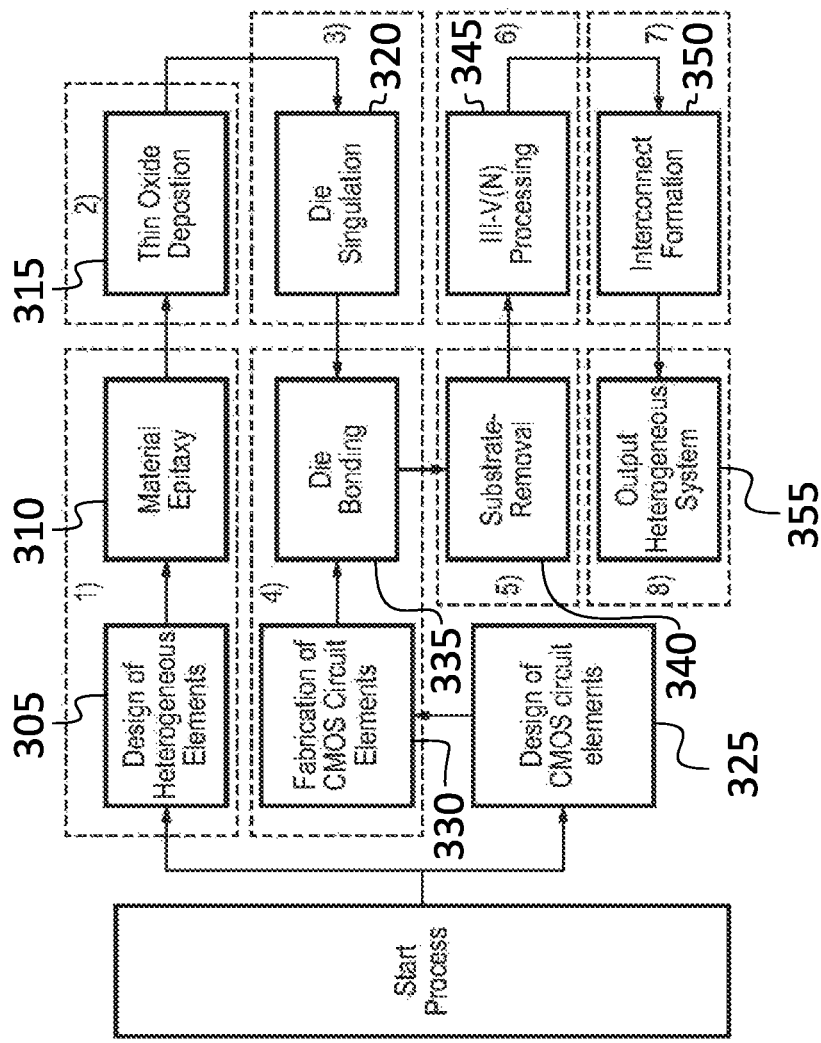
FIG. 3 is a design and fabrication flowchart, according to an embodiment of the present invention.

Die cut from a source wafer such as those illustrated in FIG. 1A-FIG. 1C may be combined with a target wafer (e.g., a silicon complementary metal oxide (CMOS) wafer) to form a heterogeneous structure, as described in further detail below. FIG. 3 shows a flow chart of a process for fabricating a heterogeneous semiconductor structure. The heterogeneous semiconductor structure is designed at 305, a source wafer is fabricated, using epitaxy, at 310, a thin oxide is deposited on the source wafer at 315, and die singulation is performed at 320, to form a plurality of source dies. The structure of the target wafer is designed at 325, and the target wafer is fabricated at 330. Die bonding (of the source dies to the target wafer) is performed at 335, the source substrate is removed (from each source die) at 340, III-N processing steps are performed at 345, and interconnects between the source die and the target wafer are formed at 350, to form the completed heterogeneous semiconductor structure at 355. These steps are described in greater detail below.

Figure 4A:
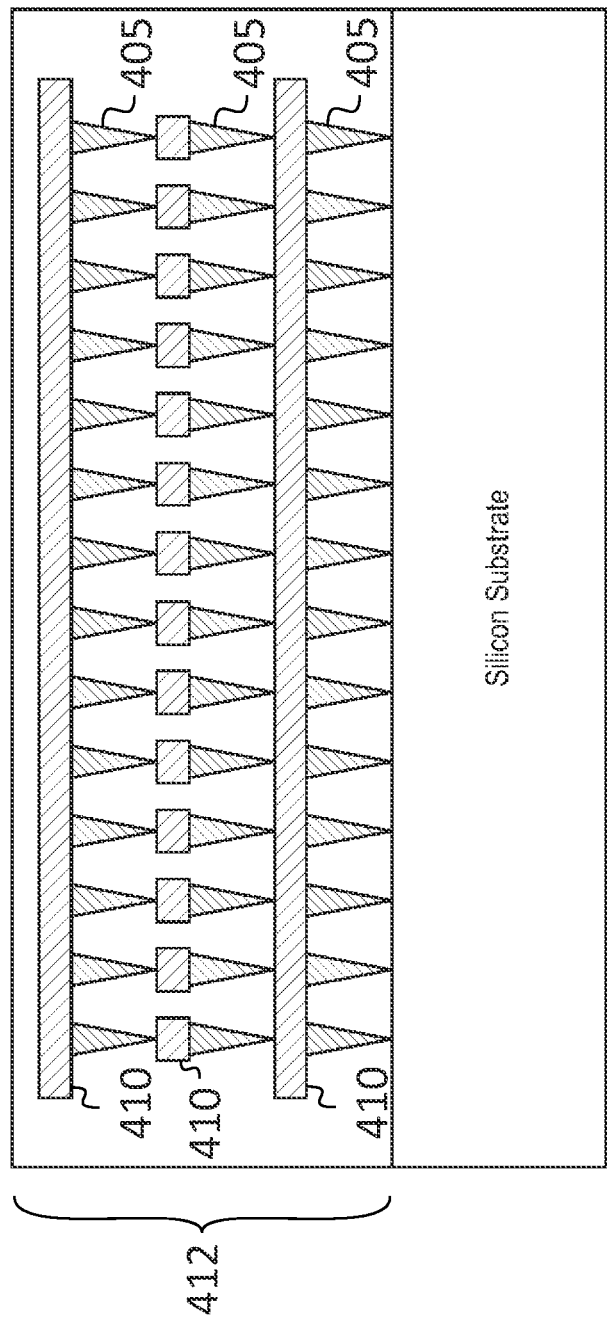
FIG. 4A is a schematic drawing of a portion of an intermediate product in the fabrication of a heterogeneous semiconductor structure, according to an embodiment of the present invention.

In some embodiments, a first intermediate product in the fabrication of a heterogeneous semiconductor structure is a target wafer a portion of which is shown in FIG. 4A, e.g., a silicon wafer on which an integrated circuit (e.g., a CMOS integrated circuit) has been fabricated. The target wafer may have a diameter of 200 mm or 300 mm. The target wafer includes one or more vias 405 and one or more patterned metal layers 410 that may form interconnections within the CMOS integrated circuit (e.g., between transistors of the circuit, not shown), and that may also be used to form connections to the source die, as described in further detail below. In other embodiments, the target wafer is a quartz, glass, or plastic wafer, or any other wafer with a relatively flat surface capable of withstanding temperatures generally in the 250° C. to 400° C. range.

Figure 4B:
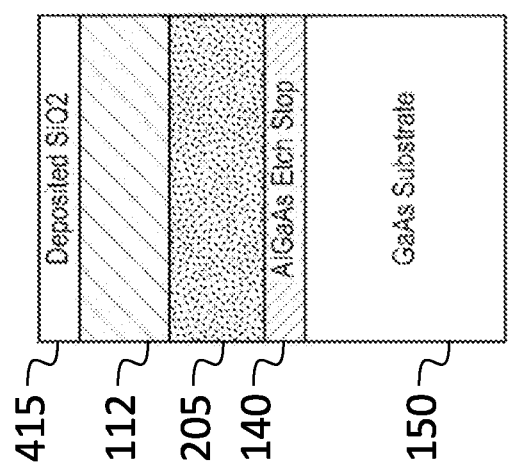
FIG. 4B is a schematic drawing of a portion of an intermediate product in the fabrication of a heterogeneous semiconductor structure, according to an embodiment of the present invention.

Referring to FIG. 4B, a thin silicon dioxide layer 415, or comparable layer as known in the art, is formed on the surface of the source wafer (i.e., on the photonic waveguide layer 112). The thin silicon dioxide layer 415 layer may be between 10 nm and 200 nm thick, and may be deposited by any method compatible with the source material, such as plasma based depositions. The silicon dioxide layer 415 provides an improved bonding surface for, e.g., a spin on glass layer that it may be bonded to, as described in further detail below, and it provides a protective barrier during singulation. The source wafer may then be coated with a temporary protective layer (e.g., a spin-on polymer layer) and diced, scribed or laser cut (back side) into individual die having a specified width and length (e.g., about 7 mm×7 mm). The protective coating is removed from the source die and the source die are transferred to a carrier and prepared for bonding to the target wafer.

Figure 4C:
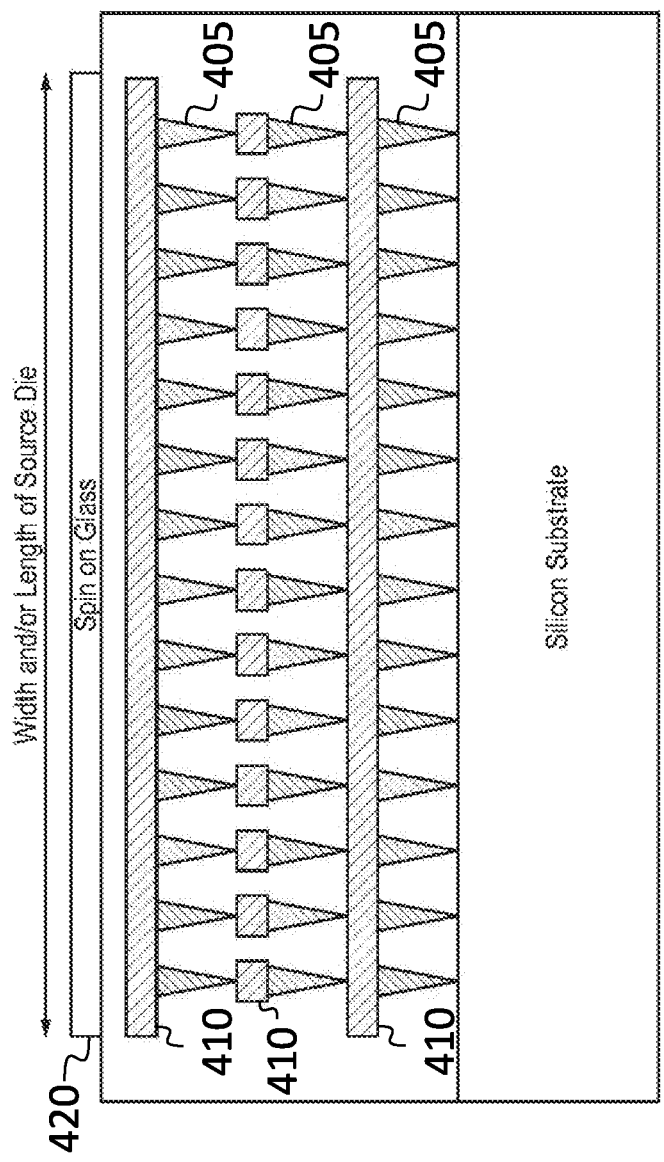
FIG. 4C is a schematic drawing of a portion of an intermediate product in the fabrication of a heterogeneous semiconductor structure, according to an embodiment of the present invention.
Figure 4D:
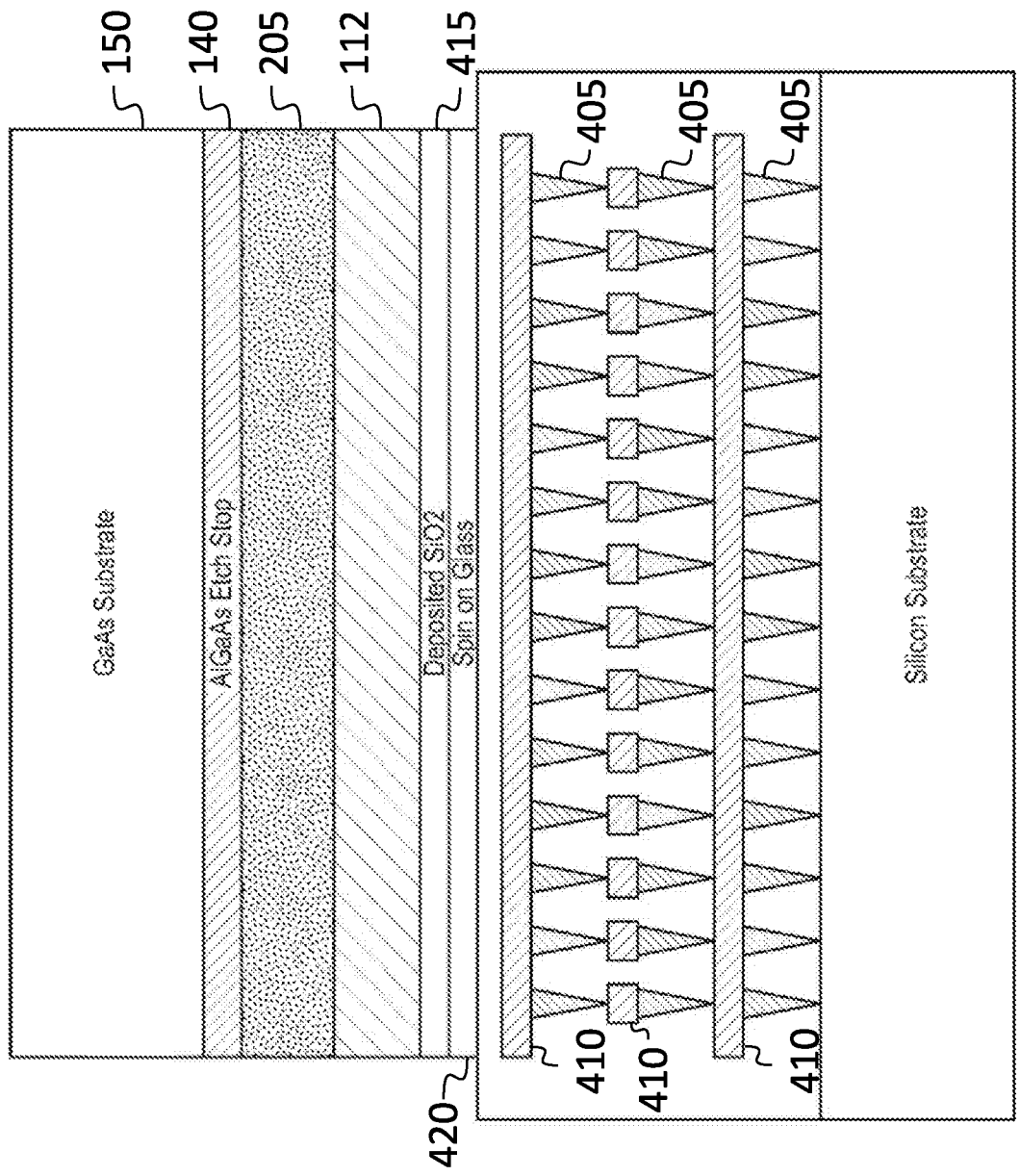
FIG. 4D is a schematic drawing of a portion of an intermediate product in the fabrication of a heterogeneous semiconductor structure, according to an embodiment of the present invention.

Referring to FIG. 4C, in some embodiments, a thin layer 420 of spin on glass is then formed on the target wafer. This may be achieved in various ways, e.g., using ink jet printing to localize the material to a region that matches the footprint of the source die to be bonded, and is located at the desired position for bonding so the placed material and die overlay each other (as shown in FIG. 4D). The thin spin on glass layer 420 may also be applied by traditional spin coating methods, nano dispense tools or imprint lithography.

The source die are then "flip chipped" onto the target wafer, i.e., they are placed onto the target wafer such that the silicon dioxide layer 415 of the source die is in contact with the thin spin on glass layer 420 of the target wafer, to form the intermediate product shown in FIG. 4D. Force is applied to achieve the desired bond line thickness. While force is applied, the temperature of the die is raised to between 150° C. and 250° C. to stabilize the materials. Once all die have been bonded, an anneal step may be performed, in which, e.g., the wafer temperature is raised to generally between 275° C. and 400° C. to ensure complete conversion of the spin on glass materials, and a sufficiently strong bond. This can be achieved in a furnace or rapid thermal processing tool. In some embodiments, the ambient environment is controlled during the anneal step. A nitrogen or argon atmosphere may be used, for example. A reduced-pressure atmosphere, with, e.g., a pressure between 1 Torr and 200 Torr may be used for the anneal step. As used herein, the term "source die" refers to a die cut from a wafer such as those illustrated in FIG. 1A-FIG. 1C, and to any remainder or augmented version of the die as it is subsequently processed as described in further detail below, e.g., removing the substrate and portions of the other original layers, and adding new layers or structures to it.

Figure 4E:
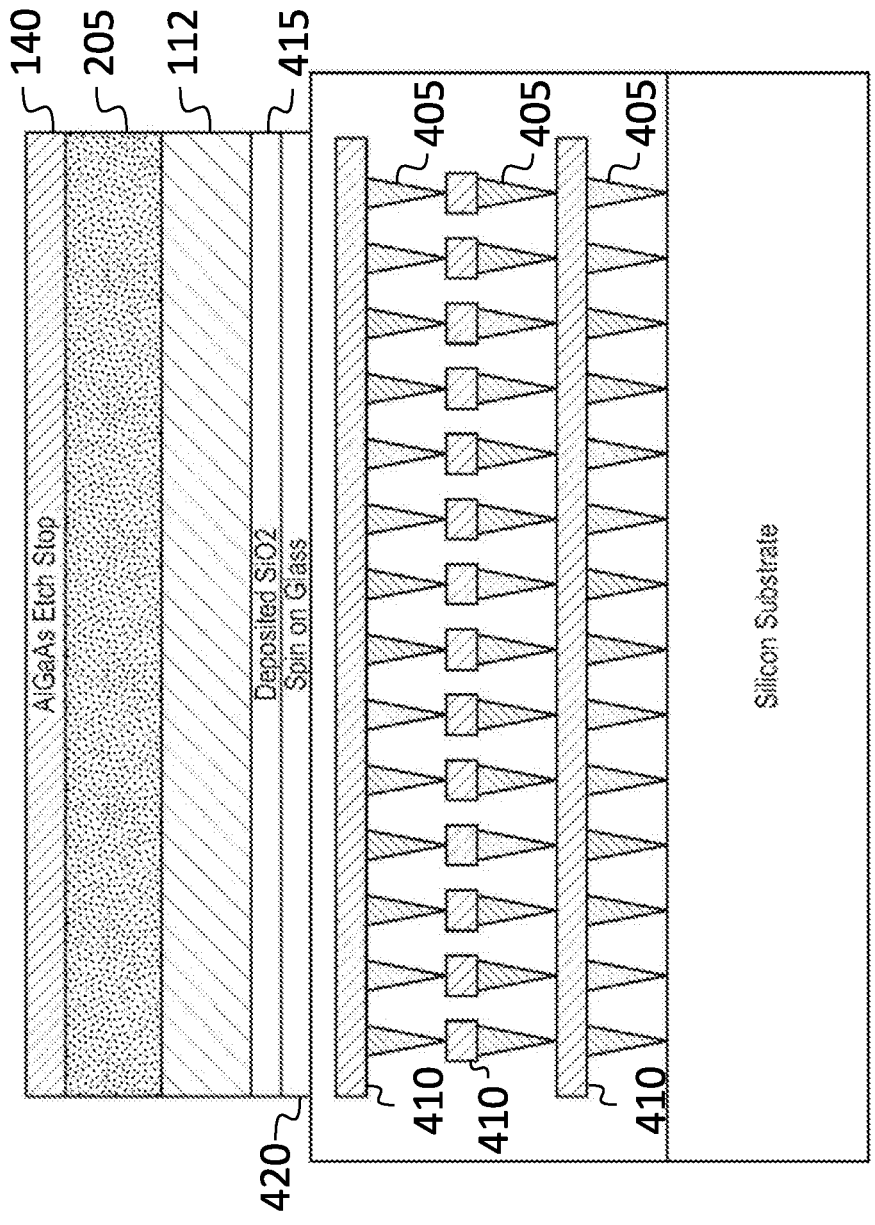
FIG. 4E is a schematic drawing of a portion of an intermediate product in the fabrication of a heterogeneous semiconductor structure, according to an embodiment of the present invention.

The source die substrate 150 then is removed to form the intermediate product shown in FIG. 4E. A temporary fill is applied between the source die, before the substrate is removed, to limit fracture at the edges of the source die during substrate removal and to protect the underlying surface of the target wafer. Most of the substrate may be removed using a combination of mechanical grinding and/or lapping; such a process may be used to remove all but 10 microns to 40 microns of the source die substrate 150. This is followed by a plasma removal step, e.g., containing SiCl4 and SF6, to remove the remaining source die substrate 150, i.e., to the AlGaAs etch stop 140.

Figure 4F:
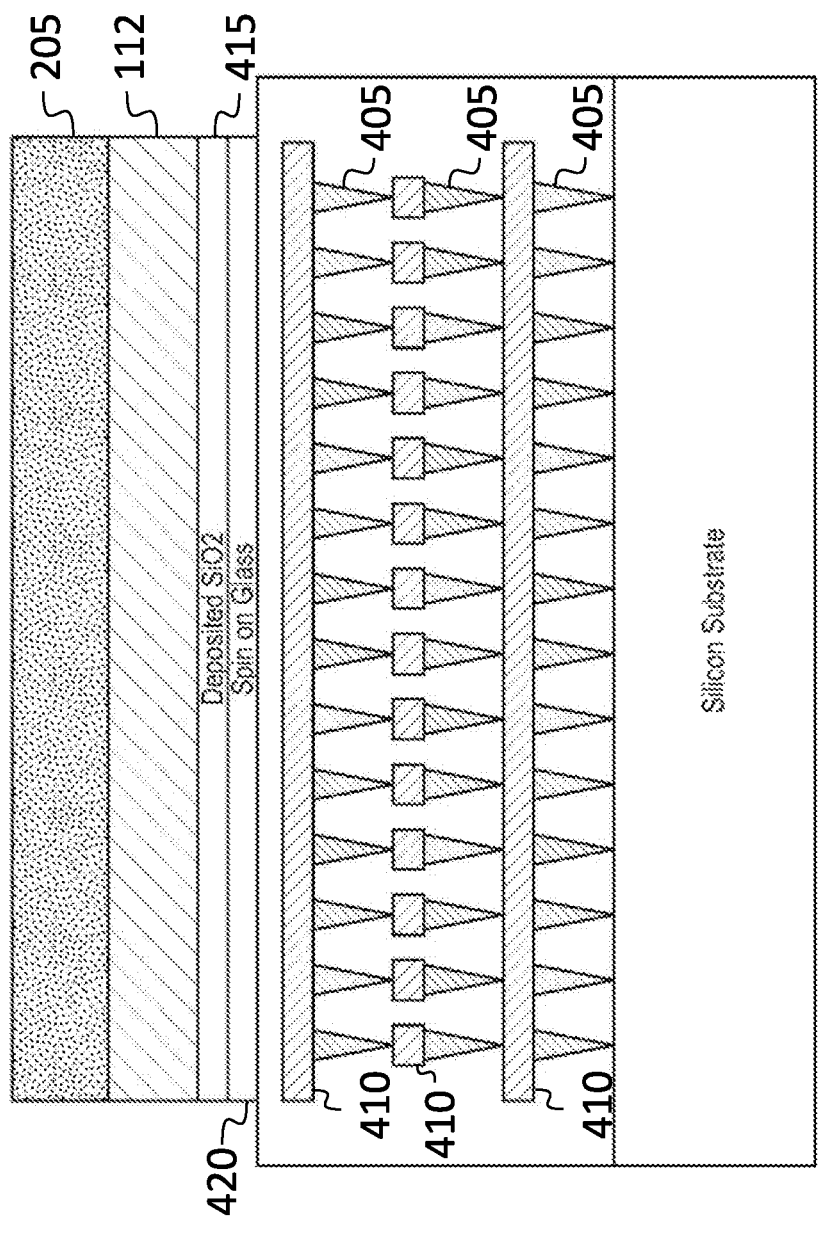
FIG. 4F is a schematic drawing of a portion of an intermediate product in the fabrication of a heterogeneous semiconductor structure, according to an embodiment of the present invention.

The AlGaAs etch stop is removed using a wet etch to form the intermediate product shown in FIG. 4F. Any of a number of highly selective wet etches may be used, such as a buffered HF, or a dilute Piranha etch H2SO4:H2O2:H2O.

Figure 4G:
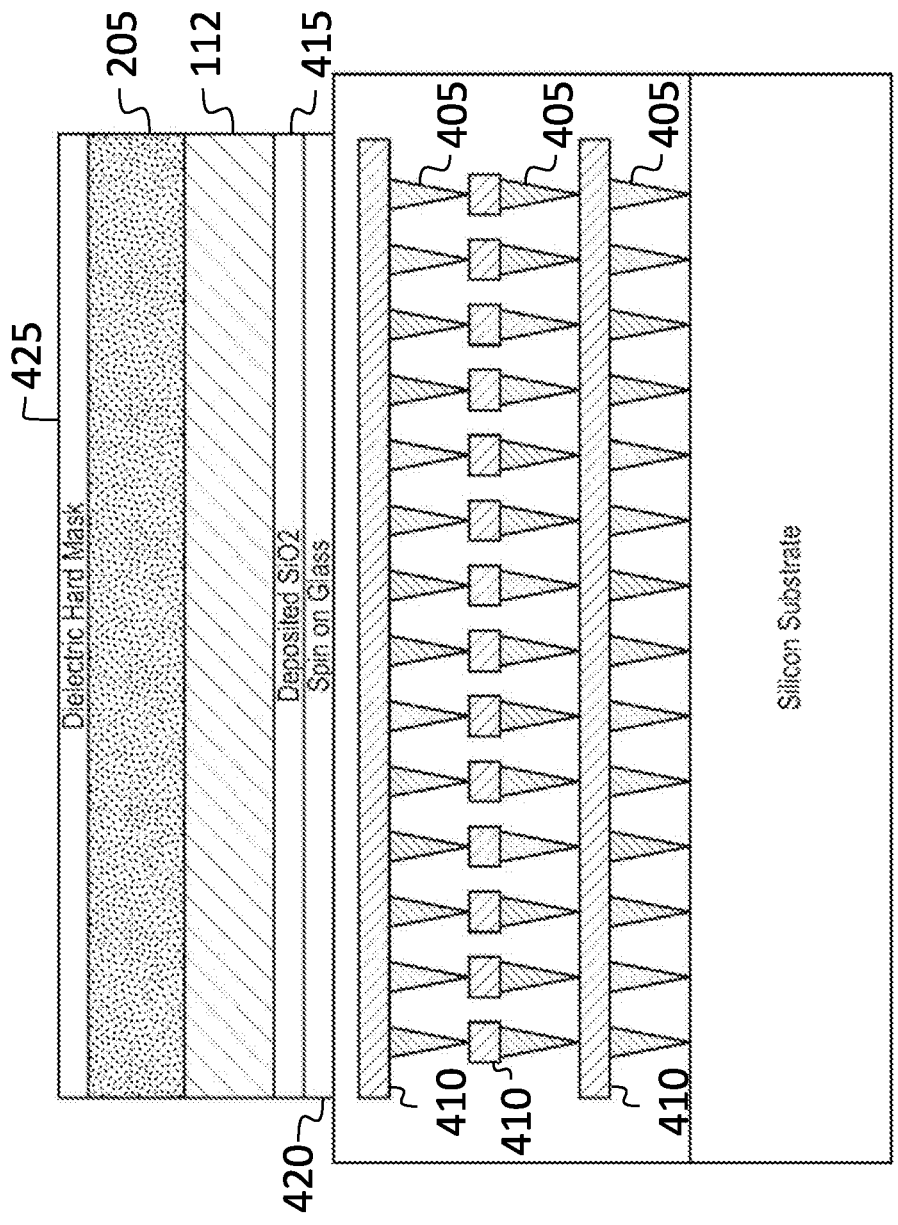
FIG. 4G is a schematic drawing of a portion of an intermediate product in the fabrication of a heterogeneous semiconductor structure, according to an embodiment of the present invention.

A dielectric hard mask 425 is then applied to the surface, to form the intermediate product shown in FIG. 4G. The dielectric hard mask may consist of 10 nm to 20 nm of e.g., SiO2 and 50 nm to 250 nm of SiNx.

Figure 4H:
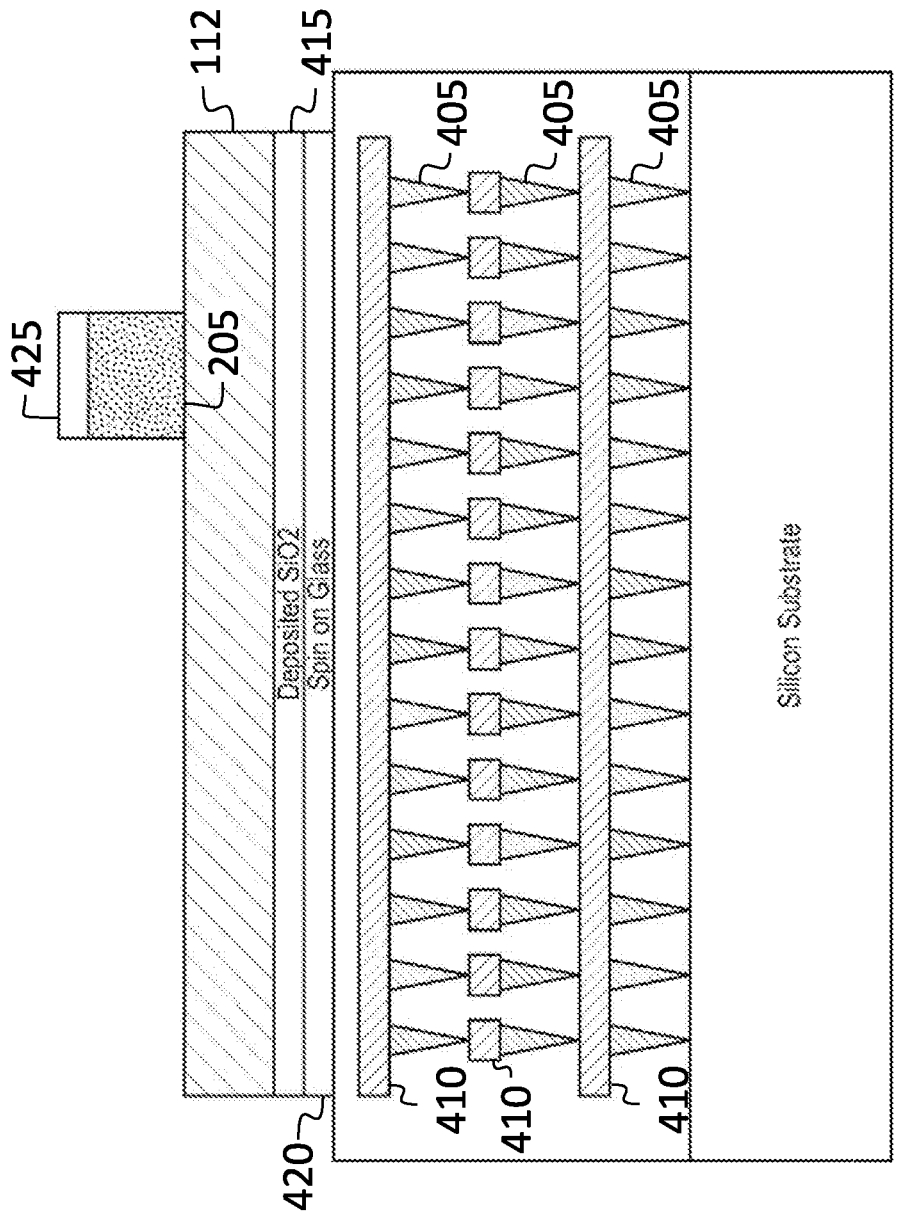
FIG. 4H is a schematic drawing of a portion of an intermediate product in the fabrication of a heterogeneous semiconductor structure, according to an embodiment of the present invention.

The wafer is patterned for an etch, and the hard mask 425 is etched and the structure is etched to or slightly into the active device cathode layer 110 (which is the upper layer within the composite photonic waveguide layer 112 shown), to form the intermediate product shown in FIG. 4H. The depth of this etch, in the regions not protected by the hard mask, may be such that both the passive waveguide layer 105, and most or all of the active device cathode layer 110, remain.

Figure 4I:
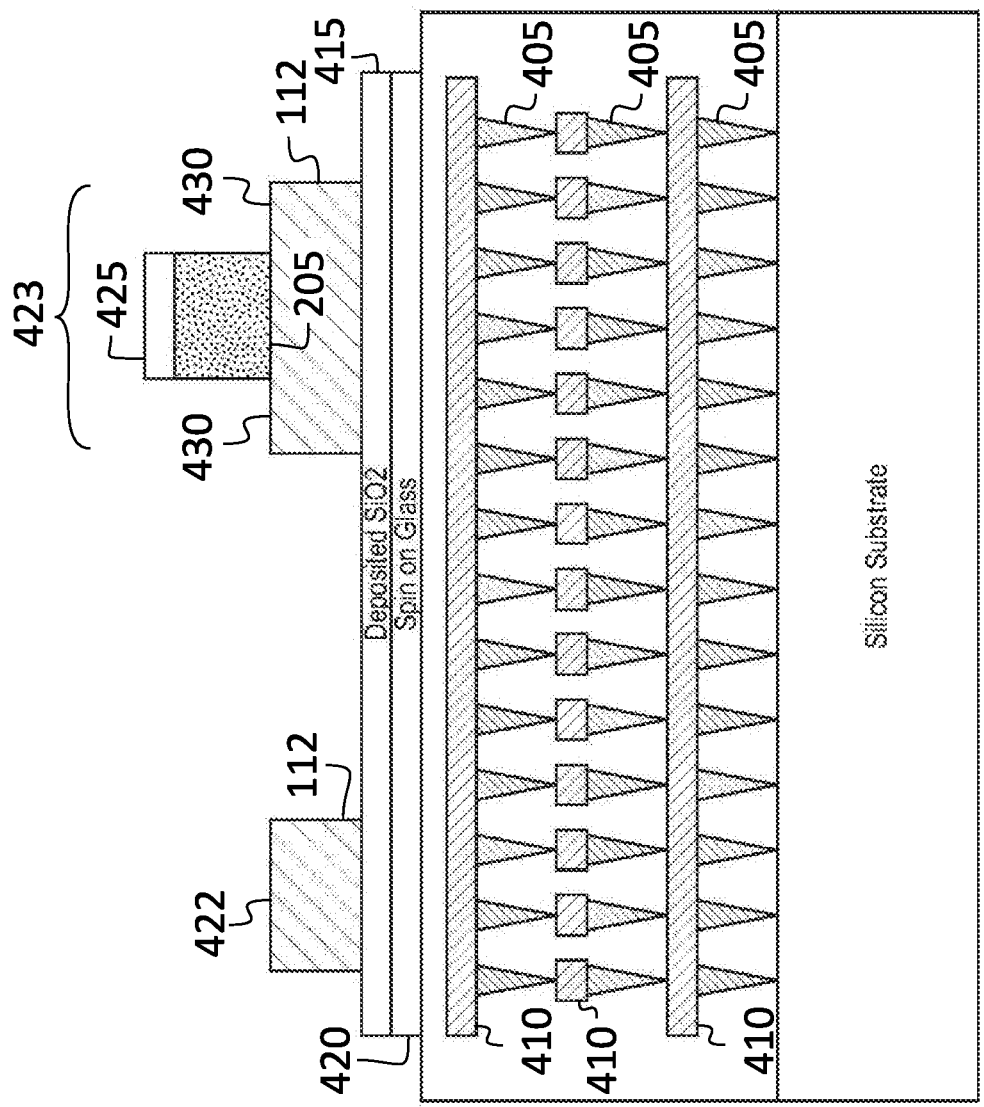
FIG. 4I is a schematic drawing of a portion of an intermediate product in the fabrication of a heterogeneous semiconductor structure, according to an embodiment of the present invention.
Figure 4J:
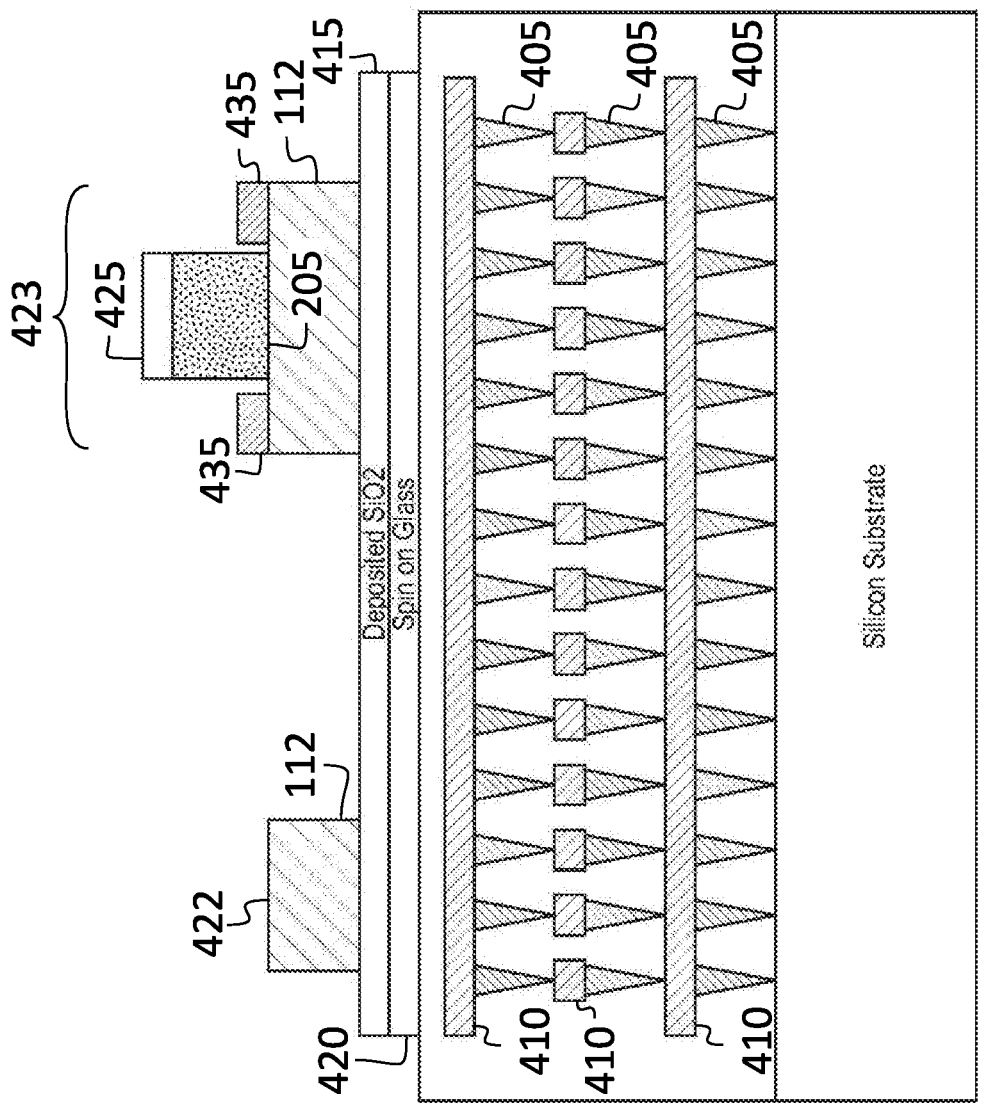
FIG. 4J is a schematic drawing of a portion of an intermediate product in the fabrication of a heterogeneous semiconductor structure, according to an embodiment of the present invention.

A second pattern (i.e., a second mask) is then employed to protect the areas not to be etched (i.e., the areas of the passive waveguide layer 105 and the cathode layer 110 to be kept). During several of the following processing steps, the dielectric hard mask continues to preserve the portions of the active device top layer 205 that are to be maintained. The photonic waveguide layer 112 is etched to the dielectric layer (i.e., to the bond layer including the silicon dioxide layer 415 of the source die and the thin spin on glass layer 420 of the target wafer) located between the source die and the target wafer, to form the intermediate product shown in FIG. 4I, including one or more channel waveguides (or "passive waveguides") 422, and active devices 423. At each active device, a region adjacent to or surrounding the region protected by the hard mask may be masked, so that the subsequent etch leaves a shelf 430 on which a cathode contact may subsequently be formed. Metal contacts 435 to the cathode are then formed, to form the intermediate product shown in FIG. 4J.

Figure 4K:
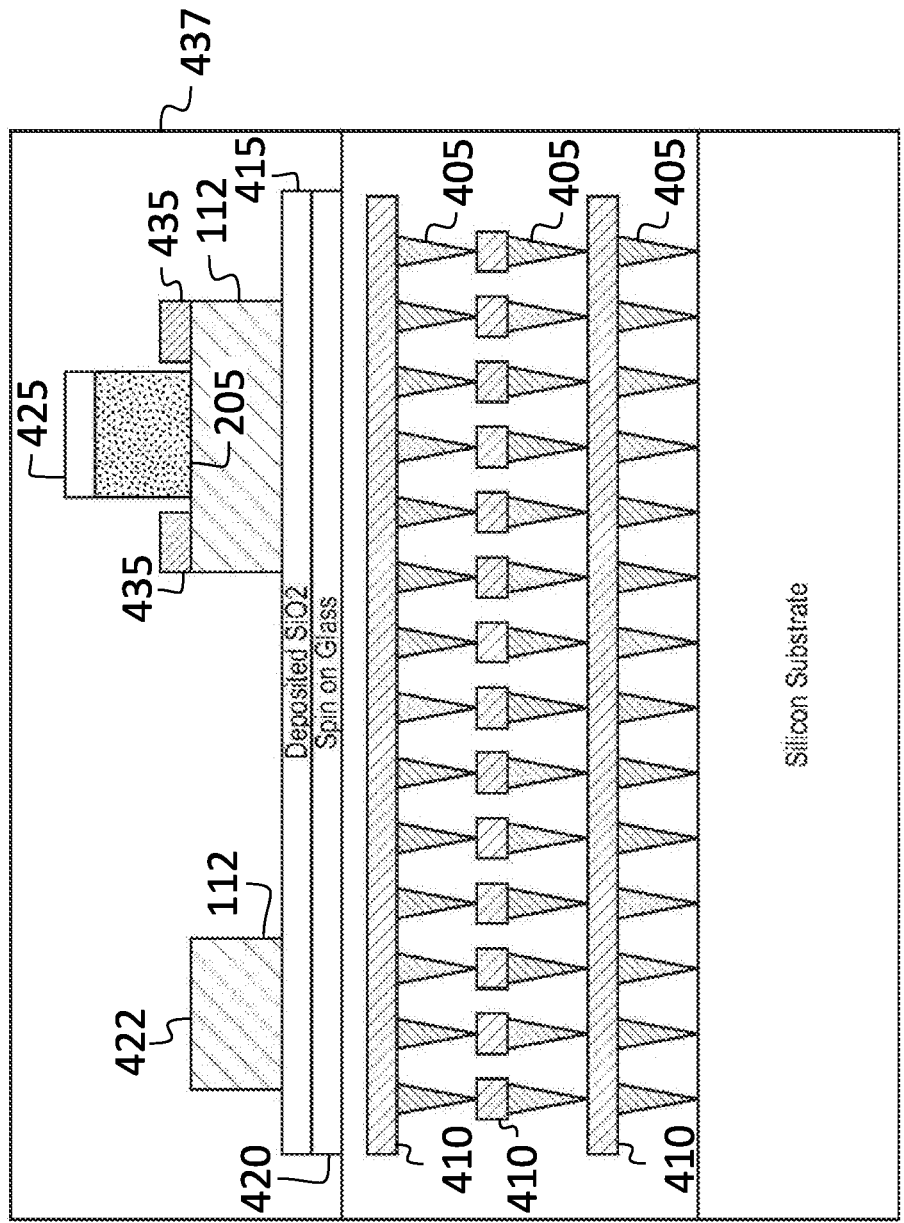
FIG. 4K is a schematic drawing of a portion of an intermediate product in the fabrication of a heterogeneous semiconductor structure, according to an embodiment of the present invention.
Figure 4L:
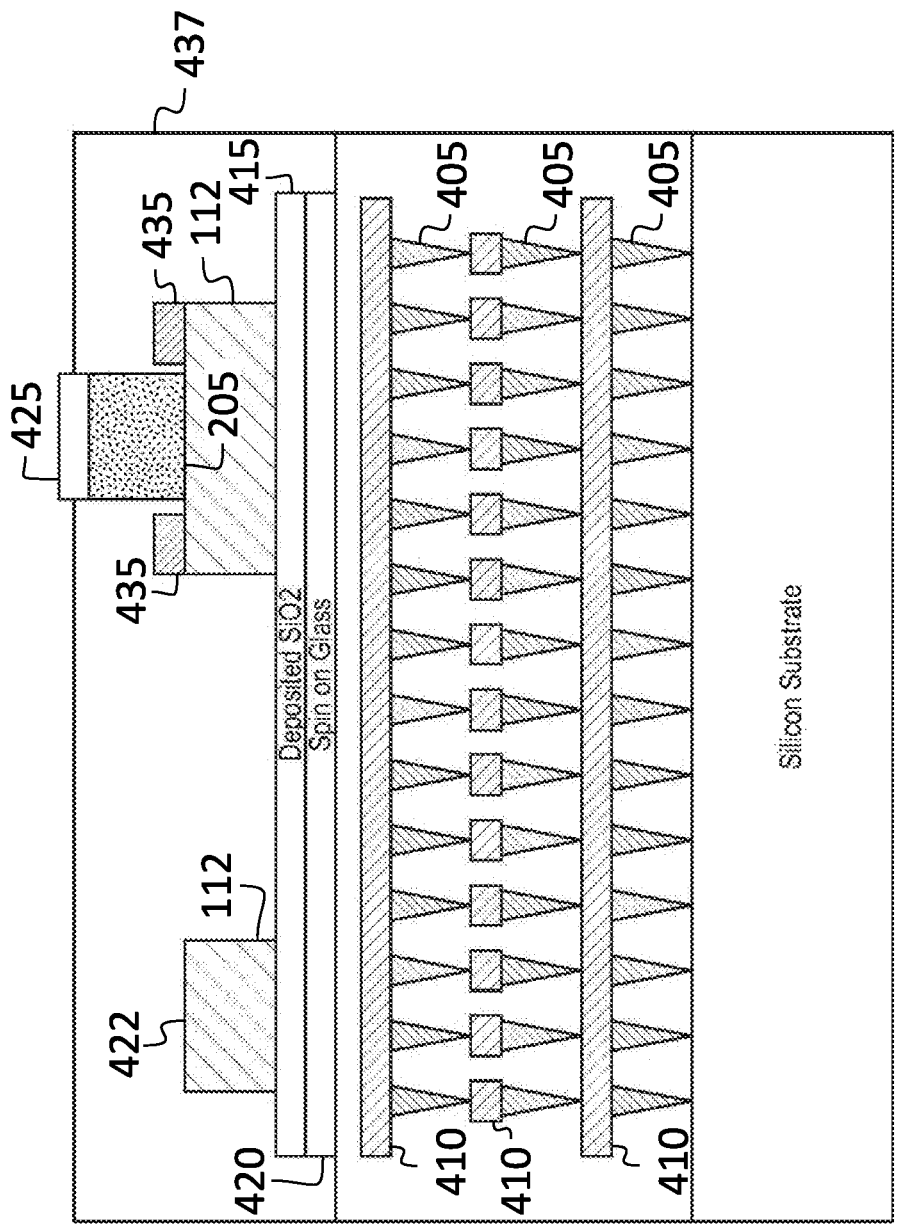
FIG. 4L is a schematic drawing of a portion of an intermediate product in the fabrication of a heterogeneous semiconductor structure, according to an embodiment of the present invention.
Figure 4M:
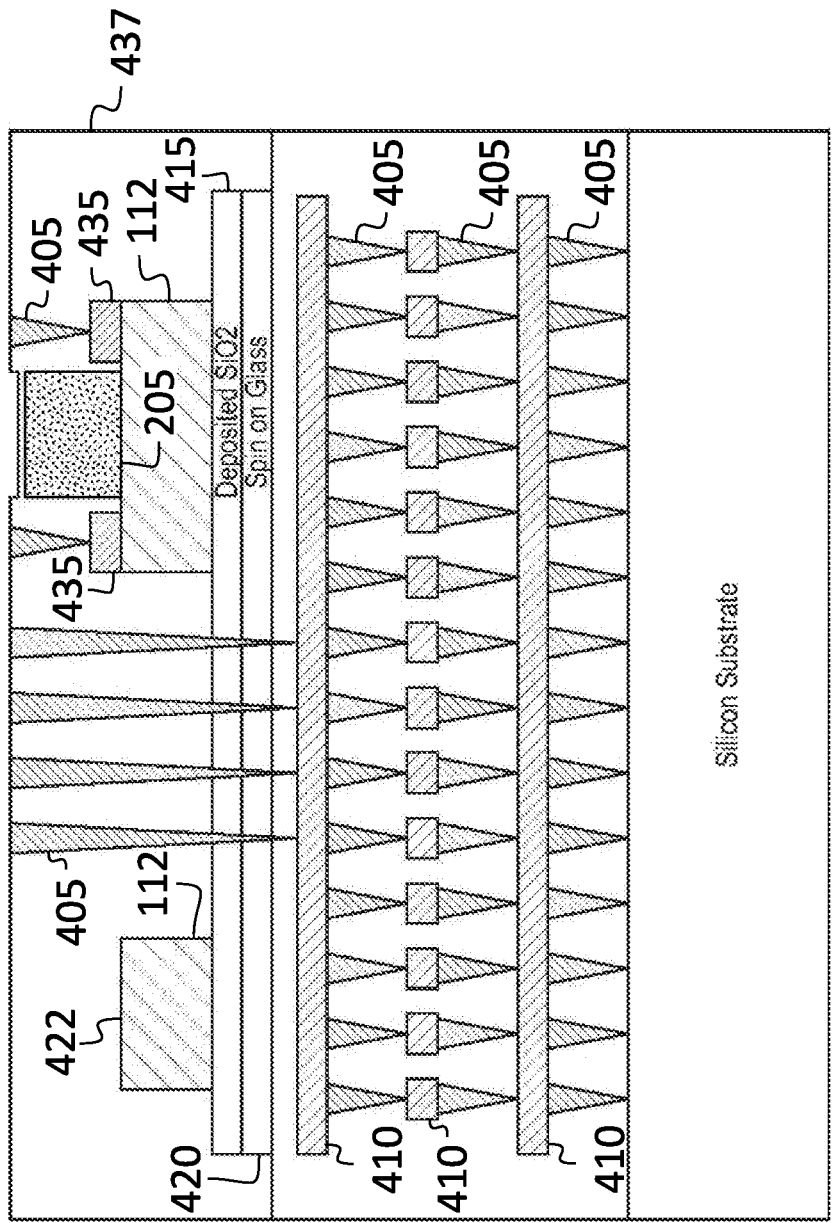
FIG. 4M is a schematic drawing of a portion of an intermediate product in the fabrication of a heterogeneous semiconductor structure, according to an embodiment of the present invention.
Figure 4N:
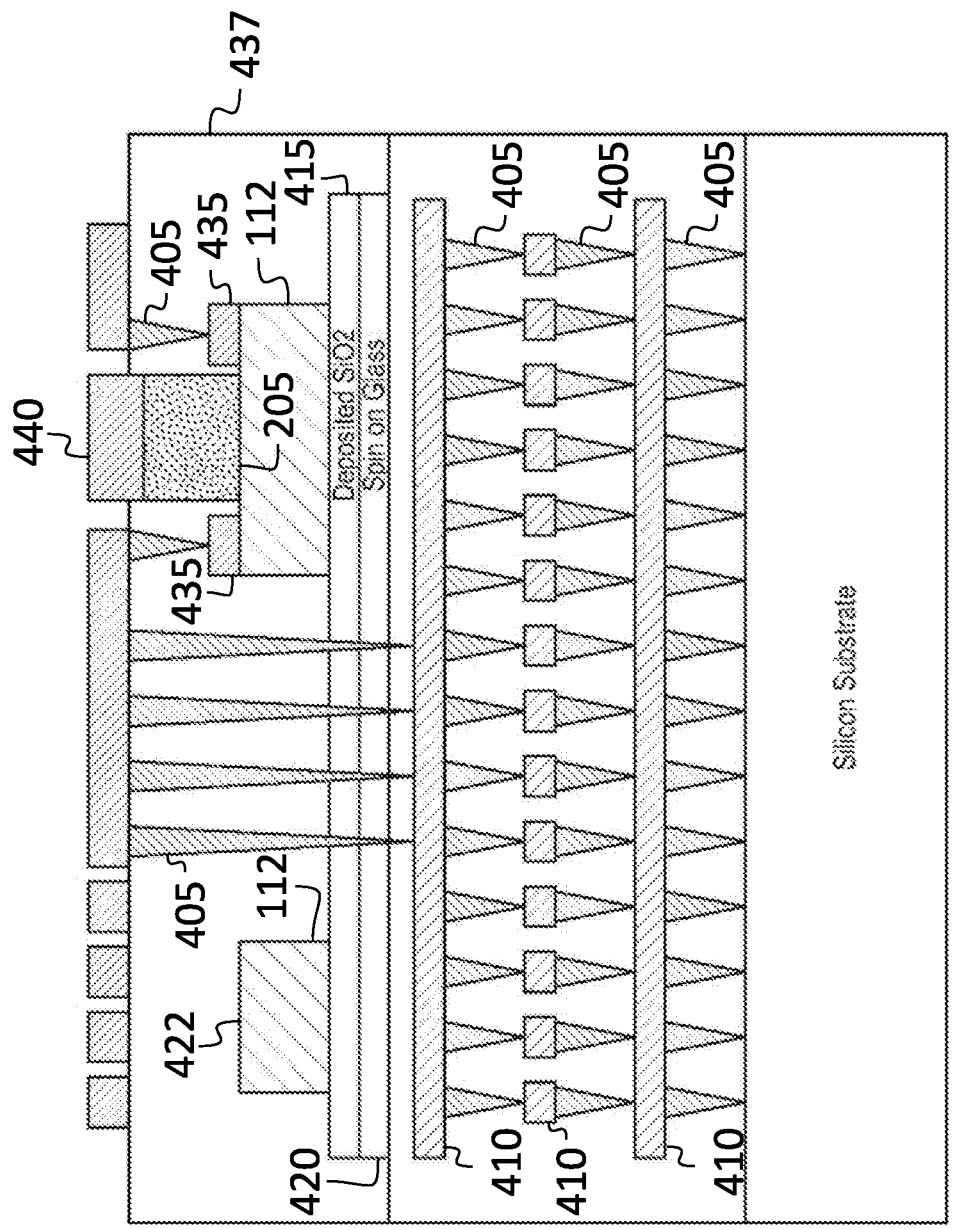
FIG. 4N is a schematic drawing of a portion of an intermediate product in the fabrication of a heterogeneous semiconductor structure, according to an embodiment of the present invention.

A cladding layer (not shown) composed of a material having a suitable index of refraction, and acceptably low loss at the operating wavelengths, is deposited on the waveguides. A thick silicon dioxide (i.e., glass) layer 437 is then deposited, to form the intermediate product shown in FIG. 4K. The layer of deposited glass 437 is then polished (e.g., using chemi-mechanical polishing selective to silicon nitride) to stop at the nitride layer of the dielectric hard mask 425. The nitride layer of the dielectric hard mask 425 is removed, a thin silicon dioxide layer is added, vias 405 are formed to the metal cathode contacts 435 and to the last metal layer 410 on the target wafer, to form the intermediate product shown in FIG. 4M. The oxide (i.e., the silicon dioxide layer) is patterned and etched to open the surface of the active device top layer 205, and metal anode contacts 440 are deposited and etched, to form the intermediate product shown in FIG. 4N. Back end of line metallization is continued to the desired number of interconnect levels, to form the heterogeneous semiconductor structure shown in FIG. 4O.

Figure 4O:
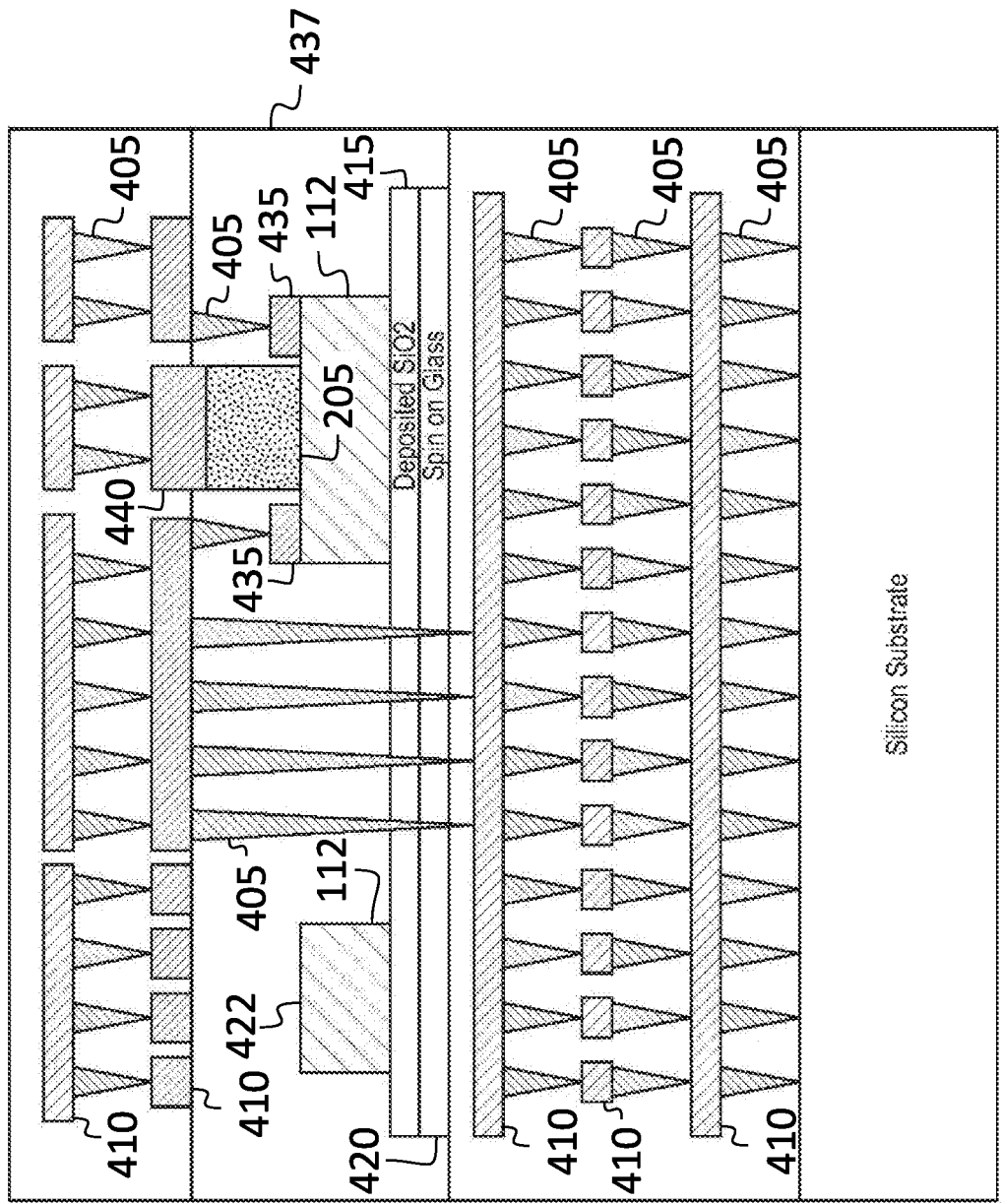
FIG. 4O is a schematic drawing of a portion of a heterogeneous semiconductor structure, according to an embodiment of the present invention.

It will be understood that additional layers of heterogeneously integrated material (photonic or electronic) may be added in an analogous manner, by repeating the process steps described above (i.e., by using the heterogeneous semiconductor structure of FIG. 4O as a target wafer). For example, spin on glass may be deposited on the heterogeneous semiconductor structure of FIG. 4O, additional source die may be bonded to it, and the source die may be processed in a manner analogous to that described in the context of FIG. 4D-4O.

In some embodiments, the use of heterogeneous integration technologies such as those described herein allows for more complex system level topologies. Multiple regions of material or circuitry may be bonded to different areas of the die surface. In some embodiments a flip chip bumped integration approach, in which a subsequent layer of microbumps is placed on an earlier hybridized layer, allows for highly complex, highly integrated system on chip components. Such an approach may be used for the integration of system level functions for optical data communications. In these cases, a lower cost silicon CMOS or bipolar CMOS double diffused metal oxide semiconductor (DMOS) (BCD) wafer may be used as the target wafer, providing tuning, interface and control functions for the photonic elements and signal routing for the high speed signals. A higher speed application specific logic circuit, and a photonic die, may then be integrated to the front side using microbumps. This approach allows the complex printed circuit board routing of signals to be moved to a more controlled environment, while at the same time simplifying the overall architecture of the packaged component. This type of complexity reduction may be relevant to the implementation of lower cost, higher data rate optical data links and active optical cables.

As used herein, the term "integrated circuit" is an electronic integrated circuit or a photonic integrated circuit. A photonic integrated circuit is an article including structures having feature that are smaller than 10 microns (e.g., semiconductor optical waveguides having transverse dimensions less than 1 micron) and including one or more devices (e.g., modulators) for converting electrical signals to optical signals or (e.g., photodetectors) for converting optical signals to electrical signals. A photonic integrated circuit may also include electronic components, e.g., transistors. As such, an integrated circuit may be both an electronic integrated circuit or a photonic integrated circuit.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used"

may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a heterogeneous integrated circuit for short wavelengths have been specifically described and illustrated herein, many modifications and variations will be apparent to those skilled in the art. Accordingly, it is to be understood that a heterogeneous integrated circuit for short wavelengths constructed according to principles of this invention may be embodied other than as specifically described herein. The invention is also defined in the following claims, and equivalents thereof.

What is claimed is:

1. A method for fabricating a heterogeneous semiconductor structure, the method comprising:
   bonding a source die to a target wafer through a bonding layer, the source die comprising a GaAs substrate and a first plurality of layers on the GaAs substrate, the bonding comprising bonding the source die to the target wafer with the first plurality of layers facing the target wafer, each of the first plurality of layers comprising cubic phase gallium nitride compounds as a major component; and
   removing the GaAs substrate.

2. The method of claim 1, wherein the target wafer comprises one or more vias and one or more patterned metal layers.

3. The method of claim 1, wherein the first plurality of layers has an overall thickness of less than 2 microns.

4. The method of claim 1, wherein the first plurality of layers comprises an active device top layer and a photonic waveguide layer, and
   wherein the method further comprises etching the active device top layer to form a first portion of an active device.

5. The method of claim 4, further comprising:
   patterning and etching the photonic waveguide layer to form:
      a passive waveguide; and
      a second portion of the active device, the second portion having a contact pad surface; and
   forming a metal contact pad on the contact pad surface.

6. The method of claim 5, wherein the passive waveguide contacts the bonding layer.

7. The method of claim 5, wherein the passive waveguide has a width greater than 30 nm and less than 80 nm, and a thickness greater than 20 nm and less than 50 nm.

8. The method of claim 5, wherein the passive waveguide has a cut-off wavelength, for a lowest-order transverse magnetic mode, of less than 500 nm.

9. The method of claim 5, wherein the passive waveguide has a width greater than 30 nm and less than 80 nm.

10. The method of claim 5, wherein the passive waveguide has a thickness greater than 20 nm and less than 50 nm.

11. The method of claim 5, wherein the passive waveguide comprises:
    a first layer of n-doped AlGaN, with a first doping concentration, on the bonding layer; and
    a second layer of n-doped AlGaN, with a second doping concentration, greater than the first doping concentration, on the first layer of n-doped AlGaN.

12. The method of claim 1, wherein the bonding layer comprises silicon dioxide.

13. The method of claim 1, further comprising an active device on the bonding layer.

14. The method of claim 13, wherein the active device comprises:
    a first layer of n-doped AlGaN, with a first doping concentration; and
    a second layer of n-doped AlGaN, with a second doping concentration, greater than the first doping concentration;
    a first barrier layer composed of intrinsic AlGaN;
    a quantum well layer composed of intrinsic AlGaN;
    a second barrier layer composed of intrinsic AlGaN; and
    a layer of p-doped AlGaN.

15. The method of claim 14, wherein the quantum well layer has a thickness of less than 5 nm.

16. The method of claim 14, wherein each of the first barrier layer and the second barrier layer has a thickness of less than 10 nm.

17. The method of claim 13, wherein the active device is configured to operate as a component selected from the group consisting of optical gain elements, modulators, and detectors.

* * * * *